United States Patent [19]

Dietze et al.

[11] 4,102,298
[45] Jul. 25, 1978

[54] DEVICE FOR DEPOSITION OF SEMI-CONDUCTOR MATERIAL

[75] Inventors: Wolfgang Dietze, Munich; Hans Stut, Groebenzell, both of Germany

[73] Assignee: Siemens Aktiengesellschaft, Berlin & Munich, Germany

[21] Appl. No.: 694,717

[22] Filed: Jun. 10, 1976

[30] Foreign Application Priority Data

Jun. 24, 1975 [DE] Fed. Rep. of Germany ....... 2528192

[51] Int. Cl.² .......................... C23C 13/04; H05B 1/02
[52] U.S. Cl. ...................................... 118/5; 118/49.5; 219/499; 219/501
[58] Field of Search ................ 118/5, 49.1, 49.5, 50.1; 219/497, 499, 501; 307/252 B

[56] References Cited

U.S. PATENT DOCUMENTS

| 2,981,605 | 4/1961 | Rummel | 118/49.1 X |
| 3,336,517 | 8/1967 | Cain | 307/252 B |
| 3,459,152 | 8/1969 | Garrison et al. | 118/5 |
| 3,548,155 | 12/1970 | Rabindran | 219/497 |
| 3,821,515 | 6/1974 | Stut | 219/501 X |
| 3,980,042 | 9/1976 | Stut | 118/5 |

FOREIGN PATENT DOCUMENTS

2,133,863   1/1973   Fed. Rep. of Germany ....... 219/501

Primary Examiner—Mervin Stein
Attorney, Agent, or Firm—Hill, Gross, Simpson, Van Santen, Steadman, Chiara & Simpson

[57] ABSTRACT

A device for supplying heating current to a semiconductor carrier in connection with the thermal separation from a reactance gas, and deposition of semiconductor material upon such a carrier, with the device being operative to supply various voltage-current combinations required to maintain constant temperature of the carrier during the deposition operation, with the current supplied to the carrier being initiated during zero passages of the A.C. supply, and with control of the number of oscillations, per unit of time, of the heating current supplied.

18 Claims, 5 Drawing Figures

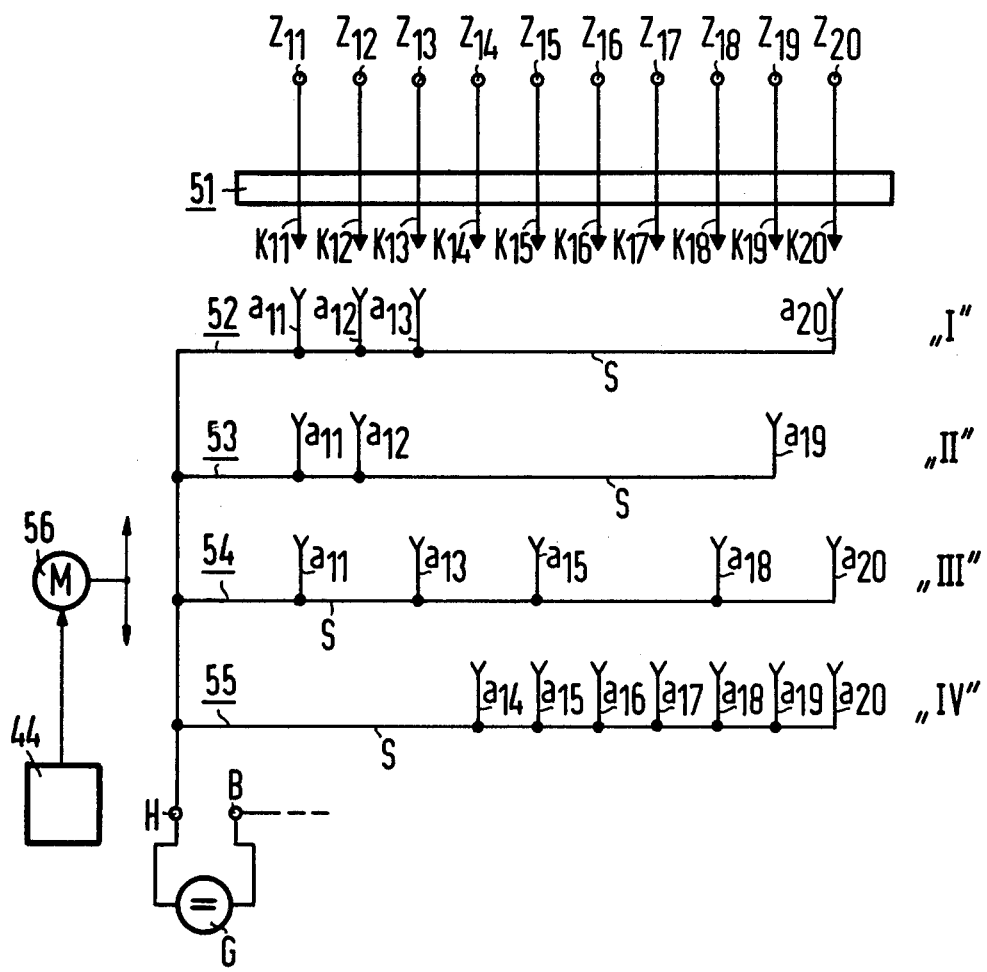

DEVICE FOR DEPOSITION OF SEMI-CONDUCTOR MATERIAL

BACKGROUND OF THE INVENTION

The invention relates to a device for use in the deposition of semiconductor material, particularly silicon, from a reaction gas, in which the semiconductor material is thermally separated and deposited upon the surface of a rod-shaped carrier constructed of semiconductor material, disposed in such reaction gas and heated, with the heating current being supplied from an alternating voltage source over a remotecontrolled electronic switch whereby the heating current can be controlled over an auxiliary voltage operable to actuate the remote-controlled electronic switch.

Such general type of device is disclosed in German Offenlengungsschrift 21 33 863 (VPA 71/1112). The arrangement therein disclosed functions as a so-called phase-gating control as the alternating current supplied is interrupted at least once per oscillation, and the carrier is maintained in a voltage-free state for a period longer than that corresponding to its zero passage, i.e., until an ignition of the electronic switch, during the particular oscillation, causes the carrier to again be supplied with operating voltage.

A device such as that described is able to stabilize the temperature of the rod-shaped carrier irrespective of its decreasing current-voltage characteristic. However, as the heating current is initiated intermediate the zero passages of the heating voltage, interfering loading of the alternating voltage source occurs, i.e., the lines supplying the required energy. In accordance with the prior art, such loading may be suppressed or eliminated by means of a so-called zero switch which, as compared with a phase-gating control, closes the electronic switch only in the zero passages of the heating voltage. Zero voltage switches of this type are described, for example, in "Siemens Bauteile-Informationen" (Siemens Component Information) 10 (1972), Volume 1, pages 1 through 4, and in "Funkschau" (Radio Review) (1971), Volume 20, pages 669, 670. However, it will be appreciated that in order to maintain the temperature constant at the surface of the carrier during the deposition operation, widely differing currents and voltages become a requirement. For example, at the beginning of the deposition process (assuming a rod-shaped carrier which has already been heated up to the deposition temperature) a high voltage with relatively little current is required and subsequently a considerably greater current with a relatively low voltage is required.

BRIEF SUMMARY OF THE INVENTION

The present invention therefore has as its objective to produce a heating system which is particularly efficient for the desired purposes, and eliminates the disadvantages of prior arrangements.

In accordance with the invention, the alternating voltage source, provided for the supply of heating current, is connected to the primary side of a transformer having at least two separate windings at the secondary side thereof, which secondary windings have like characteristics, and by means of remote-controlled electronic switches may be operatively connected to the rod-shaped carrier in various combinations, whereby respective individual windings may be connected thereto or a plurality of windings may be connected in series, in parallel or in series-parallel combinations to provide different voltagecurrent supply characteristics.

In addition, a further remote-controlled electronic switch is provided which carries the full heating current flowing through the rod-shaped carrier, which switch may be actuated by a zero voltage oscillation control unit. A combination of electronic threshold-value switches also are provided which are controlled by the heating current flowing through the rod-shaped carrier and in turn control the electronic switches adapted to connect the individual secondary windings of the transformer to the rod-shaped carrier in the desired circuit configuration.

BRIEF DESCRIPTION OF THE DRAWINGS

In the drawings wherein like reference characters indicate like or corresponding parts:

FIG. 5 is a schematic diagram illustrating the switching circuit for effecting the desired connections of the secondary windings.

The illustration of a reaction container, required for the deposition, and the means for supplying the reaction gas have been omitted from the drawings, and it will be appreciated that these may be provided in conventional manner, for example, in accordance with German Letters Patent 1,220,391.

DETAILED DESCRIPTION OF THE INVENTION

Figure 1:
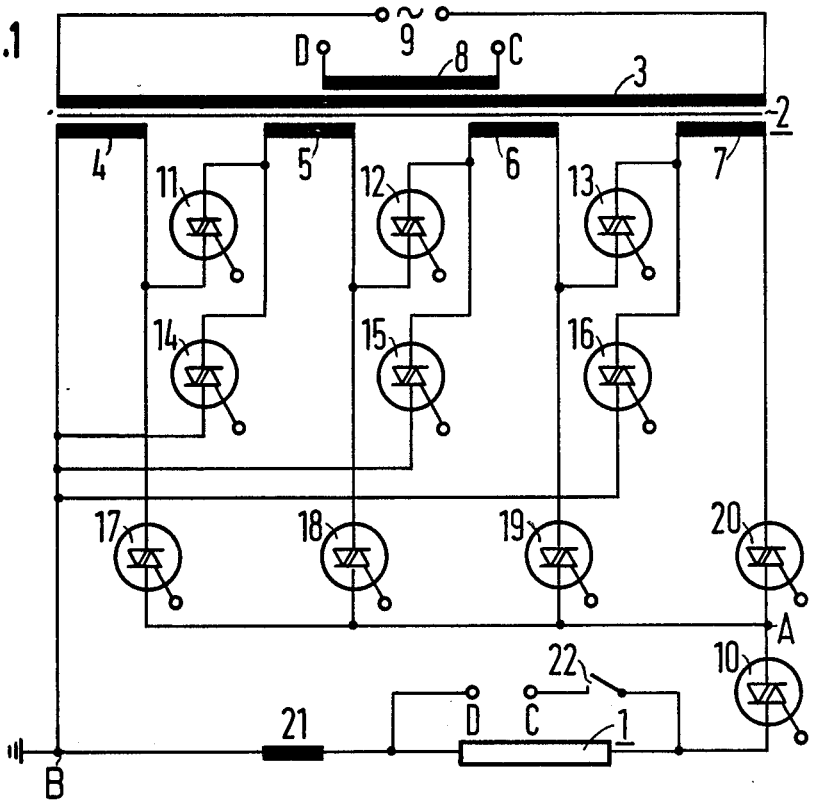
FIG. 1 is a schematic circuit diagram of a power supply for a rod-shaped carrier.

Referring to FIG. 1, the carrier member 1 which, for example, may be in the form of a silicon rod, is connected in series with a remote-control electronic switch 10 which carries the same current as that flowing through the carrier 1, the latter being provided with electrodes which contact its respective ends, and with a sensor 21 being provided in the heating circuit to monitor the heating current. The heating current is adapted to be supplied from a plurality of secondary windings of a power transformer 2, supplied to points A and B and thus to the series circuit comprising the Si rod 1, the sensor 21 and the electronic switch 10. The primary winding 3 of the transformer 2 is adapted to be supplied from an alternating voltage source 9, more particularly, the conventional power supply main or line. Secondary windings 4, 5, 6 and 7 of the power transformer 2, which are to supply the current for the rod-shaped carrier 1, are of like construction, i.e., of like electrical voltage-current characteristics, and may be connected in series with the rod 1 and associated elements 10 and 21 by means of a plurality of remote-control electronic switches 11 through 20. FIG. 1 additionally illustrates a further secondary winding 8, adapted to be connected to or disconnected from the rod-shaped carrier 1 by means of a switch 22, and so designed that it may supply a considerably higher voltage at switch points C and D, as compared with the voltage supplied by the windings 4–7. It is adapted to be employed to heat the carrier 1, which will initially be at room temperature, possibly supplemented by a suitable device producing additional charge carriers in the rod 1 by radiation, for example, by means of an infrared lamp. As soon as the voltage supplied by the series connection of the four secondary windings 4–7 is adequate to provide sufficient operational current to heat the carrier 1 to the required deposition temperature (in the case of Si, approximately 1000–1300° C.), the winding 8 and any additional charge carrier producing device will be disconnected.

Where rod-shaped carriers composed of silicon are involved, for example, with a length of 6m, and a current source 9 supplying alternating current, a power transformer 2 will generally be sufficient for the supply of the desired operational current if the primary side is dimensioned for a power of, for example, 600 kVA, with the secondary windings 4–7 being respectively dimensioned to provide 150 V maximum voltage and a maximum power of, for example, 150 kVA. While the secondary winding 8 may be omitted, if provided, it is generally recommended to dimension it for 2 kV and a power of 100 kVA. Normally, four secondary windings will be sufficient for the supply of operational current, although it is, of course, possible to employ variations.

To avoid interfering harmonic waves the secondary windings, provided for the supply of the heating current required during the deposition operation and supplied to the silicon rod 1 over a zero voltage switch, should be uniformly dimensioned, i.e., they should have equal ohmic resistances, equal self-induction coefficients, equal capacitances and equal mutual inductances with respect to the primary winding 3 of the power transformer 2.

In the arrangement of FIG. 1, a plurality of remote-control electronic switches 10–20 are provided for the control and regulation of the heating current flowing through the silicon rod 1. This is achieved by control of the alternating voltage, having a frequency of n-oscillations, to vary the number of oscillations applied to the rod-shaped carrier 1 per unit of time, and also by control of the amplitude of the applied voltage and the power or current thereof by utilization of a corresponding combination of secondary windings of the power transformer 2. The first of these is accomplished by the use of an oscillation-control unit, known per se, and the second by the use of a threshold-value switch, previously mentioned, which actuates the electronic switches 11–20 of FIG. 1 in such manner that the respective voltage-current requirements for the desired heating of the rod 1, in conjunction with the oscillation control unit, will provide the desired electrical voltage at the switch points A and B.

For example, if it is desired to supply the rod 1 with heating current from all of the windings 4–7, connected in series, switches 11, 12, 13 and 20, as well as the switch 10, will be rendered conductive, while the remaining switches will be open, i.e., blocked. This operational condition of switches 11–20 will normally be required during or directly after the rod has been heated to the deposition temperature, as this arrangement will most efficiently supply the required heating current to the carrier 1, which in this case has only a small initial diameter and thus a high resistance. This operational state will hereafter be designated "I."

As the diameter of the carrier 1 begins to increase, in the course of the deposition procedure, whereby its resistance and voltage requirement decreases somewhat, one of the secondary windings, most simply the winding 7, may be dropped out of the circuit whereby the carrier 1 will be supplied with heating current by only the remaining three windings, for example, the windings 4, 5 and 6. This operational state, hereafter designated "II," can be achieved, for example, by rendering switches 11, 12, 19 and 20 conductive while the remaining switches remain in a blocked condition.

If, in the further course of the deposition procedure the electrical resistance of the silicon rod decreases still further, the series connection of merely two windings may suffice for the voltage supply. However, since the power requirement becomes larger and larger, usually two of the secondary windings of the power transformer, for example, the windings 4 and 5, will be connected in series, as will be the windings 6 and 7, with the two such series-connected windings being connected in parallel to jointly supply current for the rod-shaped carrier 1. This mode of operation, designated "III," may, for example, be achieved by rendering switches 11, 13, 18, 15, 20 and 10 conductive while the other switches remain blocked.

When the carrier 1 finally has become very thick due to the deposition, relatively very little voltage will be required but a relatively large current must be supplied which can be achieved by a parallel connection of all of the individual secondary windings 4, 5, 6 and 7, which parallel connection of the secondary windings with the rod 1 is designated "IV," and may be achieved by rendering switches 14, 15, 16, 17, 18, 19, 20 and 10 conductive while the remaining switches remain in blocked condition.

It will be appreciated, from a reference to FIG. 1, that it is also possible to connect any of the individual windings 4, 5, 6 or 7 to the silicon rod whereby the latter will obtain minimum power and also minimum voltage. In this event, in order to connect the individual winding 4 with the rod 1 it is merely necessary to render switches 17 and 10 conductive while the remaining switches 11–16 and 18–20 remain in blocked condition. If it is desired to individually apply one of the other secondary windings 5–7 to the rod 1, all switches 11–20 must be blocked with the exception of the corresponding two switches associated with the selected winding. This operational state, in which only one winding is operatively connected to the rod, is only infrequently required, for example, in connection with short rods and the like.

It will be apparent that the switch 10 does not enter into the selection of the secondary winding or combination of windings to be connected to the silicon rod 1, nor does it serve for determination of the amplitude of the heating current, but merely enables the determination of the number of oscillations which are to pass through the silicon rod 1 per second, i.e., in other words, forms an oscillation control. As a result, it will be apparent that during the deposition operation, the switch 10 of the circuit of FIG. 1 must be actuated between conductive and blocked states much more often than switches 11 and 20.

It will also be noted that the switch 10 can be omitted by effecting a transfer of its functions to the switches 11–20, which possibility will be explained in greater detail in connection with FIGS. 4 and 5. In this event, the oscillation control unit must be suitably circuited with one of the switches 11–20, carrying current in the respective operational states I through IV, or an oscillation control unit must be provided for each switch. On the other hand, a thyristor or triac 10 carrying the entire heating current in operational state IV, as well as possibly in state III, can be relatively expensive.

It will be further noted that where at least two secondary windings are connected in parallel with one another, the oscillation control unit may be used with only a part of the secondary windings 4–7 connected to the rod 1 in an operational state. This would, for example, be possible in operational state IV by a corresponding control of one or two of switches 17, 18, 19 whereby the voltage supplied by one or two windings 4–7 will be continuously applied to the rod 1 while the voltage supplied by the remaining winding or windings is controlled.

It will be assumed in the following that the switch 10 is present and is provided for the exclusive oscillation control, in view of which the switch 10 is employed with the arrangements of FIGS. 2 through 5. However, if the switch 10 is omitted in such arrangements, its function would then be taken over in each case by at least one of the switches 17–20. Likewise, it would be possible to provide the oscillation control unit in the primary circuit of the power transformer 2.

Remote-controlled, and thus, at least three-pole semiconductor devices or circuits, may be considered for switches 10–20, which are so dimensioned with respect to the applied and controlling heating voltage that they can be switched from a non-conductive state to a conductive state only by a corresponding ignition voltage, with reverse switching into the non-conductive state automatically taking place upon the absence of the ignition voltage at the next following zero passage due to the pnpn-structure of the switches. Especially suitable for this purpose are three or four-pole semiconductor thyristors, in particular like thyristors which are circuited antiparallel to one another, desirably in a monolithic combination, i.e., triacs. The switch 10 thus must be placed into a conductive state, by means of a corresponding ignition supply impulse at the zero passages of the heating voltage, in such a way that only full alternating current oscillations are passed and supplied to the silicon rod 1. An oscillation control unit may be constructed in various ways, it being essential only that electrical impulses, operable to ignite the electronic switch 10 are derived which occur synchronously with the zero passages of the heating current flowing through the carrier 1.

Figure 2:
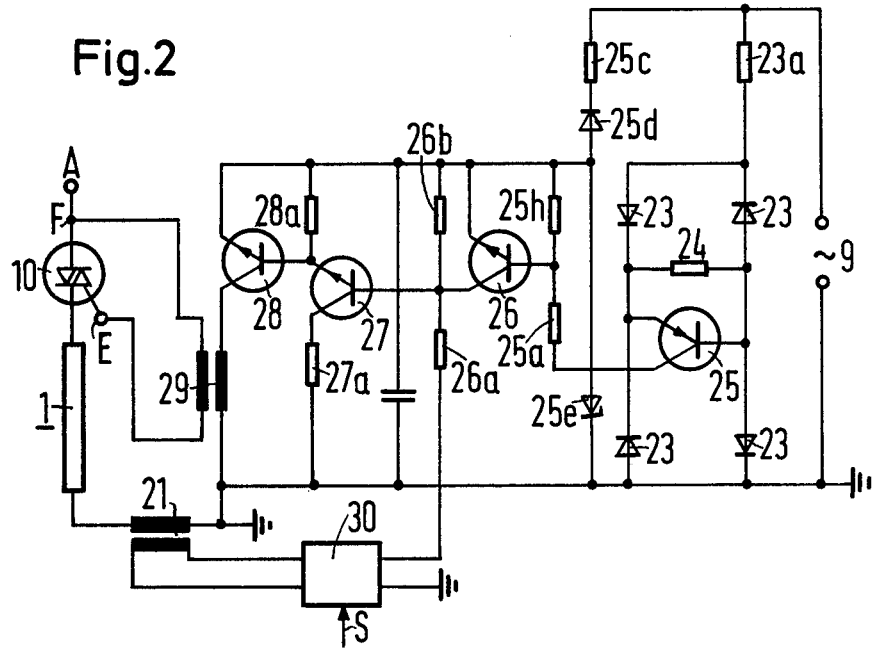
FIG. 2 is a circuit diagram illustrating a zero-voltage switch suitable for the oscillation control unit.
Figure 3:
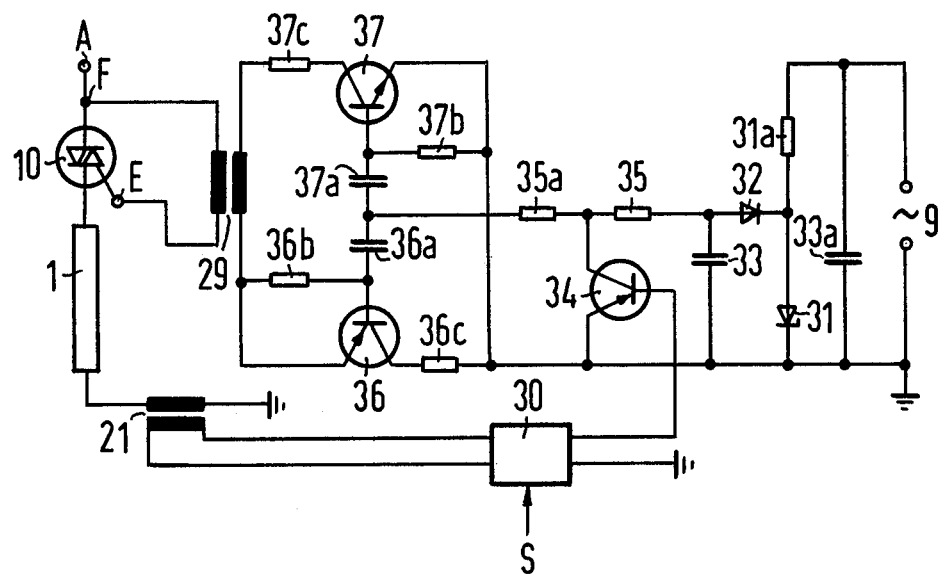
FIG. 3 is a schematic circuit diagram of a modified form of zero-voltage switch.

FIG. 2 illustrates one favorable possibility while FIG. 3 illustrates another. Both of these are briefly described hereafter.

Considering first the circuit of FIG. 2, the primary component thereof is a circuit composed of four like semiconductor diodes 23 circuited in correspondence to a full wave rectifier bridge, with the emitter-base path of a transistor 25, for example, a pnp transistor, and a parallel connected fixed resistance 24 disposed in the one diagonal branch, while either the voltage source 9 of the primary circuit of the power transformer 2 of FIG. 1, or an auxiliary voltage derived from the heating current, for example, over a transformer, particularly over a preceding resistor 23a, is connected in the other diagonal branch of the bridge. Diodes 23 of the rectifier bridge are so circuited with respect to the voltage, and the parallel resistance 24 is so selected that the collector of transistor 25 is current-free only when none of the four diodes 23 carry a current, and thus during the zero passages of the voltage 9 supplied to the rectifier bridge.

The base electrode of a transistor 26, complementary to the transistor 25, is connected by a resistor 25a to the base of the transistor 25 while the emitter-base path of the transistor 26 is shunted by a resistance 25h which, with the resistance 25a, forms a voltage divider which is supplied by the current source supplying the rectifier bridge composed of the diodes 23, i.e., over a voltage-limiting circuit composed of the resistance 25c, rectifier diode 25d and Zener diode 25e. The circuiting of the individual elements, as well as the dimensioning of the various resistance values, are so selected that the transistor 26 will draw current only when the collector of the transistor 25, controlling the base potential of the transistor 26, is current-free. Thus, pulses will occur at the collector of the complementary transistor 26 during each zero passage of the voltage 9 supplying the bridge comprising diodes 23, and thus of the heating voltage supplying the silicon rod over point A, whereby such pulses are synchronously applied to the primary side of a transformer 29 over an amplifier cascade formed by transistors 27 and 28. The secondary side of the transformer 29 is operatively connected to the ignition electrode of the thyristor or triac 10 and/or at least one of the switches 11–20. The remaining elements in FIG. 2, not referred to, i.e., the voltage-divider resistors 26a, 26b and resistors 28a, 27a are operative to provide the supply voltage for transistors 27 and 28. In addition, the voltage-divider resistor 26a serves to effect a connection of a regulator 30 which, on the one hand is connected to the sensor 21, sensing the heating current, and on the other hand is connected to a desired value generator indicated by the arrow S.

FIG. 3 illustrates a further embodiment of a zero-voltage switch. The line voltage source 9, supplying the heating current, is bridged by a series connection of a Zener diode 31 and a fixed resistor 31a, as well as by a parallel capacitor 33a. The series circuit is so dimensioned that a breakthrough of the Zener diode 31 occurs during each half wave of the alternating voltage supplied at 9, with a constant direct voltage being obtained over the rectifier diode 32 and the capacitor 33 bridged by the Zener diode 31. The impulses occurring at the Zener diode 31 are in the form of rectangular impulses whose flanks are synchronous with the zero passages of the heating voltage supplied to the silicon rod 1.

Alternate short control impulses will be supplied over divider members 35, 35a and capacitors 36a, 37a to the base and emitter electrodes of the mutually complementary (otherwise, equally dimensioned) transistors 36 and 37, which amplify such pulses, and from which they are conducted to the transformer 29, and thereby to the terminal E of the ignition electrode of the thyristor 10. Transistors 36 and 37 are provided with suitable base resistances 36b and 37b and load resistances 36c and 37c. The capacitor 36a and the base-collector path of the transistor 36, as well as the voltage-divider resistor 35a of the divider circuit 35, 35a are bridged by the emitter-collector path of a transistor 34 which is of the same type as the transistor 36, and thus complementary to the transistor 37. The arrangement is regulated by means of a regulator 30, connected to the base of the transistor 34, with the regulator 30 being controlled by a sensor 21, responsive to the heating current, and also by a desired-value generator schematically designated by the arrow S.

Figure 4:
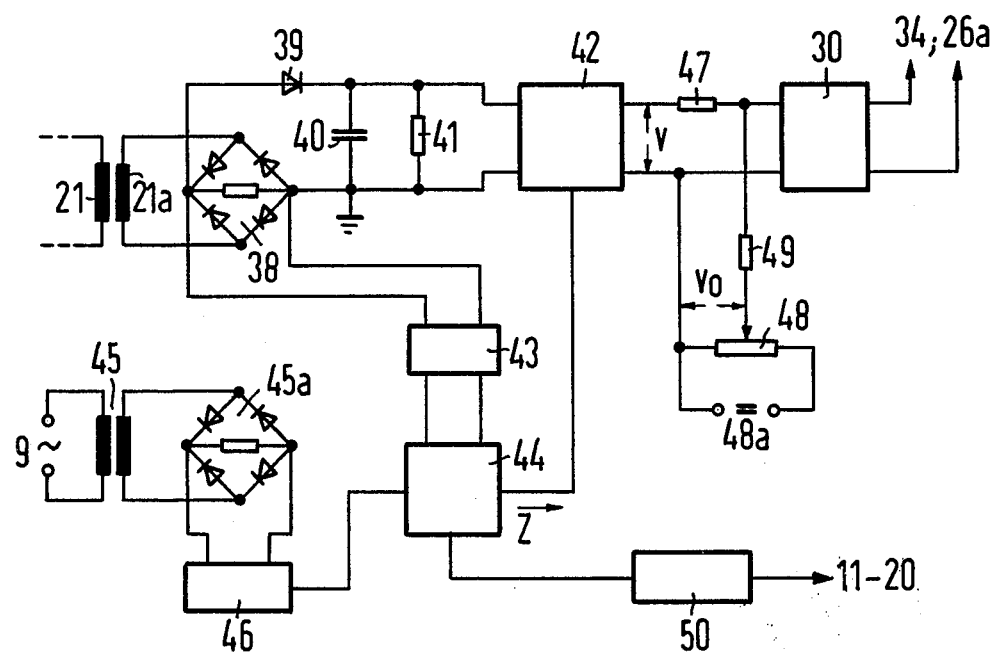
FIG. 4 is a schematic circuit diagram of a control circuit for the arrangements illustrated in FIGS. 1, 2 and 3.

In connection with the regulator 30, it will be appreciated that in addition to the arrangements illustrated in FIGS. 4 and 5, a number of other possibilities exist with respect to the design thereof, as for example, an arrangement which includes two equal, but anti-parallel connected luminescent diodes which are cooperable with a common phototransistor to produce a direct voltage proportional to an effective value of the heating current sensed by means of the sensor 21, whereby such direct voltage is utilized as a regulatory value for the control, over a so-called Hall-effect watt meter. The voltage supplied by such device, and proportional to the square of the effective current strength $J_{eff}$ is then employed as the control value for an automatic regulation. It is, however, the objective of the invention to provide a particularly favorable arrangement based on an entirely different concept. To aid in the understanding thereof, it is believed that a short, analytical observation may be useful.

As is known, the effective value of the heating current $J(t)$ is defined by the relation $$J_{eff}^2 = \frac{1}{T} \int_0^T J^2(t)\, dt \quad (1)$$

whereby it is justified in the present case to insert $$J = J_o \sin(2\pi n \cdot t) \quad (2)$$

for $J(t)$, whereby $J_o$ is the amplitude, $\pi$ Ludolph's number and n the frequency of the voltage supplied by the A.C. voltage source 9 and $o$ the heating current $J(t)$, respectively. For the time T, the duration of one second is assumed which is dependent on the duration of the oscillation control unit.

The zero-voltage switches in accordance with FIGS. 2 and 3 are operative to supply only m ($m \leq n$) oscillations or cycles of the total number of n (for example, 50) oscillations of the voltage supplied by the heating voltage source are operative to produce a heating current in the silicon rod, with the latter being current-free for the duration of $n-m$ oscillations per second, so that for such period, $J(t)$ is not $J(t) = J_o$ sine $2\pi n \cdot t$, but $J(t) = 0$. Since the value of the undefined integral is $$\int \sin^2 2\pi n \cdot t \cdot dt = \frac{1}{2 \cdot 2\pi n \cdot t} (2\pi n \cdot t - \cos(2\pi nt) \cdot \sin(2\pi nt))$$

the integral can be determined between $t = 0$ and $t = m/n$, $$J_{eff} = J_o \sqrt{\frac{m}{2n}} \quad (3)$$

In the derivation, the amplitude $J_o$ has been considered as a constant, although it depends essentially on time $t$. However, the time dependency is not sufficiently great that it would become noticeable during the measured time or during an oscillation, so that the amplitude $J_o$ may be considered as a time-independent magnitude during the calculation of the effective value $J_{eff}$.

As the frequency n is a fixed magnitude, the purpose of the required regulation is the supervision of the amplitude $J_o$ and the supervision and control of the number m of the oscillations passed per second. By means of these magnitudes, a direct voltage v is derived, analogous to the effective value $J_{eff}$ of the heating current $J(t)$, in particular proportional thereto. Such direct voltage v is compared with a direct voltage $v_o$ in a regulation path produced by a desired-value generator, and the difference voltage obtained is employed for controlling the zero-voltage switch which is utilized, and in particular, is designed in accordance with FIGS. 2 or 3.

Such an arrangement is advantageously constructed in accordance with the circuit of FIG. 4 in which the sensor 21 illustrated in FIGS. 1, 2 and 3, utilized for sensing the heating current flowing through the silicon rod 1 is operatively connected to a device for the derivation of a magnitude proportional to an amplitude $J_o$, as well as suitable for obtaining m and n, and by means of this device, an electrical direct voltage is derived in accordance with formula (3), which is proportional to $J_{eff}$. This thus represents the voltage v above referred to, which, to be exact, is a magnitude varying with time.

The sensor 21 advantageously may be provided in the form of a low loss electric transformer, with the current $J(t)$ flowing through the silicon rod 1 being applied to the primary transformer winding. The secondary winding 21a is in turn connected to a full wave rectifier circuit, i.e., a rectifier bridge 38 which, together with a rectifier 39, particularly a semiconductor diode, a charge capacitor 40 and a fixed resistance 41, connected in parallel thereto, forms a peak value rectifier whereby a voltage $u\, J_o$, proportional to the amplitude of the heating current $J(t)$ flowing at the primary side of the sensor 21, appears at the output resistor 41. This voltage is thus supplied to the input of a multiplier 42, in particular a hybrid multiplier.

The rectified alternating voltage appearing at the rectifier bridge 38 not only is a measure for $J_o$ but also for the number m of the oscillations released by the zero-voltage switch in accordance with FIGS. 2 or 3. For this reason, the voltage impulses per second produced at the rectifier bridge are counted with an impulse counter 43 performing this function, and which supplies the number m, so obtained, to a micro-processing calculator 44 (as may be supplied, for example, by the firm of Intel).

A further sensor 45, again particularly a transformer, is operative in connection with the control of the frequency n of the voltage producing the oscillation control, as well as the heating current J, for example, the voltage supplied by the voltage source 9. In this case, the sensor 45 is supplied with the voltage 9, which also supplies the power transformer 2, or is supplied with a voltage synchronous therewith and is operable over a rectifier bridge 45a to supply impulses to a second impulse counter 46, which supplies the frequency n, required for obtaining $J_{eff}$ in accordance with formula (2), to the second input of the previously mentioned calculator 44 with the impulses being supplied in digital form. The calculator 44 is so constructed and adjusted that is supplies, from the numbers m and n obtained by the impulse counters 43 and 46, a number proportional to the magnitude $(m/2n)^{\frac{1}{2}}$ which is in the form of an electrical voltage. This voltage is applied to the second input of the previously mentioned multiplier 42 and a direct voltage V, proportional to the effective value of the heating current $J(t)$ appears as its output which is supplied to the input of a regulator amplifier generally designated by the reference numeral 30, over a fixed resistance 47. As in the circuit of FIG. 2 it is supplied to the resistance 26a or in the circuit of FIG. 3 to the transistor 34 and thereby controls the circuit of the corresponding figure.

The resistor 47 simultaneously functions as a summation point for the application of the direct voltage v with the desired value $v_o$, in the form of a difference formation, in such a way that the control voltage appearing at the output of the regulator amplifier 30 does not change the operational state of the zero voltage switch, and thus the number m, as soon as $v$ equals $v_o$. A direct voltage source 48a represents a desired-value generator, and it is supplied, over a potentiometer 48 whose movable contact is connected to the summation point 47 of the regulator circuit over a resistance 49, in the form of a difference formation with the direct voltage appearing at the output of the multiplier 42. The desired-value generator thus comprises a direct voltage source 48a and potentiometer 48 with the movable contact being connected to the resistor 49. The voltage $v_o$ supplied by the desired-value generator is superimposed in the form of a difference formation of the voltage $v$ supplied by the multiplier 42.

The desired value-generator 48a advantageously is correlated with an operational parameter of the silicon rod 1 which is to be maintained constant during the deposition operation. The surface temperature of the silicon rod 1 may be employed for this purpose, which is supervised in conjunction with an opto-electrical pyrometer, for example by means of an infrared photodiode, not illustrated in the drawings. The latter, in such case, controls the position of the movable contact of the potentiometer of the desired value-generator 48a, in accordance with the information supplied by the pyrometer whereby, in the event of a decrease of the surface temperature of the silicon rod 1, the reference voltage $v_o$ is increased, and that when the temperature increases, such voltage is decreased, with no change occurring in the presence of a constant temperature. This operation may be achieved by the utilization of an electric current, supplied by the pyrometer, for the control of a servo motor, in particular a stepping motor, whereby the motor starts only during a change of the pyrometer current, and the rotational direction of the rotor is analogous to the respective sign (−or+) of such change.

The calculator 44 or the impulse counter 43, respectively, determines the number m of the oscillations of the heating current J(t) which are passed per second, and m may assume practically any integer value between 0 and n. If, in the event that the regulation for the heating current which is supplied as a result of the zero-voltage switch, due to the variation of m, is no longer sufficient for the particular combination of secondary windings of the power transformer 2 connected to the silicon rod 1, whereby such heating current will not maintain the surface temperature of the silicon rod constant, another amplitude $J_o$ of the heating current must be produced by a corresponding change in the combination of secondary windings supplying the current, so that there will then exist adequate leeway for regulation in accordance with m.

Thus, a range for m, represented by two values $m_1$ and $m_2$, advantageously may be substituted for m within which range m may fluctuate without requiring a change in the supply souce of the heating current to the silicon rod and in which condition $$o\ m_1 \leq m \leq m_2 = m. \quad (3)$$

If m falls below the lowest limit $m_1$, a combination of secondary windings will be applied to the silicon rod 1, by suitable actuation of the thyristors 11-20, whereby voltage applied to the rod will decrease, and in like manner, if m exceeds the upper limit $m_2$, an increase in such voltage will be correspondingly provided.

For this operation the calculator 44 is equipped with a device which also supervises the difference between the numbers n and m, and in the event a maximum or minimum as determined by (3) is exceeded or not reached, a control device 50 is actuated, operable to effect a corresponding switching over of the thyristors 11-20.

Such a control device is illustrated in FIG. 5. The four different operational states I–IV of the thyristors 11-20 have previously been described and they are incorporated in the following table in which the present of an "x" indicates that the respective switch is conductive.

| Operational State | Switch | | | | | | | | | | $U_n$ |
|---|---|---|---|---|---|---|---|---|---|---|---|
| | 11 | 12 | 13 | 14 | 15 | 16 | 17 | 18 | 19 | 20 | |
| I | x | x | x | — | — | — | — | — | — | x | 4U |
| II | x | x | — | — | — | — | — | — | x | — | 3U |
| III | x | — | x | — | x | — | — | x | — | x | 2U |
| IV | — | — | — | x | x | x | x | x | x | x | U |

These operational states are usually required in the indicated succession and accordingly the operational state I is initially required. Experience shows that the required m will decrease and consequently if $m_1$ is not reached, it is possible to switch to the combination II, whereby the desired results are achieved with $m = m_2$. These operations are repeated until all of the operational stations I–IV are completed.

The last column of the table, under the designation $U_n$, represents the heating voltage which is applied to the rod-shaped carrier 1 during the respective positions of the switches 11-20, corresponding to the respective operational states I–IV, with U representing the voltages supplied by one of the secondary windings 4-7. In consideration of the condition (3), it will be appreciated that the output voltage supplied by the calculator 44 passes the same maximum value $(m_2/2n)^{\frac{1}{2}}$ and the same minimum value $(m_1/2n)^{\frac{1}{2}}$ during each of the operational states of switches 11-20. The occurrence of these extreme values of the voltage supplied by the calculator 44 to the multiplier circuit 42 is associated with the actuation of a signal controlling the threshold value switch 50 and with the device coupled with the calculator 44.

As will be apparent from the table, since the transistion between the operational states I–IV occur, in a succession from I to IV, or conversely, form IV to I, and in each case in one-step increments, the provision of only two kinds of signals characterizing the direction of the desired transition are required, i.e., a forward and a reverse signal. If, for example, the operational state II results from the operational conditions of the switches 11-20, the advance or forward signal will exist when a decrease of m occurs beyond the boundary value $m_1$, and it will ensure that the threshold value switch 50 will recognize that the operational state supplying the next-lower voltage (in accordance with the last column of the table) is required, i.e., the operational state III in this case. If, however, n increases above the boundary value $m_2$, a reverse signal is required in order to effect the operational state I of the switches 11-20, which is now required with the next higher voltage.

The threshold value switch 50, illustrated in conjunction with FIG. 5, represents a simple embodiment which presents the necessary operational requirements in more simple form than would be illustrated with a more exotic example, for example, a threshold value switch which is produced by monolithic logical linkages. However, in actual practice, such a more modern construction would normally be preferred, for example, in the form of shift registers.

Referring to FIG. 5, the ignition electrodes of thyristors 11–20 illustrated in FIG. 1, are designated by reference characters $Z_{11}$–$Z_{20}$ and are connected with respective contact elements $K_{11}$, $K_{12}$, $K_{13}$, ... $K_{20}$, over corresponding electric lines, whereby the contact elements are positioned in a fixedly defined geometric arrangement, in particular upon a contact board or member 51 of insulating material which, for example is mounted in a fixed position. Cooperable conductive contact elements, designated as respective contact banks 52–55, are operable to provide the desired operational switch states I–IV and are disposed upon a suitable insulating carrier which can be shifted with respect to the contact elements $K_{11}$–$K_{20}$. The contact bank 52 thus is operative to provide the operational state I, bank 53 the operational state II, bank 54 the operational state III and bank 55 the operational state IV.

Each of the contact banks 52–55 include a common conductive bus bar S, or the like, from which conductive branches extend to the respective contact elements $a_{11}$–$a_{20}$, which may be brought into cooperable engagement with the contact elements $K_{11}$–$K_{12}$ in accordance with the switching requirements of the operational state which is to be maintained.

In accordance therewith, bank 52 is operative to effect the operational state I and merely carries contact elements $a_{11}$, $a_{12}$, $a_{13}$ and $a_{20}$ which are to conductively engage contact elements $k_{11}$, $k_{12}$, $k_{13}$ and $k_{20}$. In like manner the bank 53 is provided with contact elements $a_{11}$, $a_{12}$ and $a_{19}$ adapted to engage corresponding contacts $k_{11}$, $k_{12}$ and $k_{19}$ to provide operational state II.

Similarly, bank 54 is adapted to provide operational state III with contact elements $a_{11}$, $a_{13}$, $a_{15}$, $a_{18}$ and $a_{20}$ connected to the corresponding contacts $k_{11}$, $k_{13}$, $k_{15}$, $k_{18}$ and $k_{20}$. As operational state IV requires merely connection of contact elements $k_{14}$–$k_{20}$, bank 55 is provided with contacts $a_{14}$–$a_{20}$. Consequently, by a simple step-by-step shifting of the contact banks 52–55 disposed upon a common insulated carrier, the contacts associated with the ignition electrodes $Z_{11}$–$Z_{20}$ are automatically connected with the ignition voltage G in accordance with the desired operational state.

By means of a stepping motor 56, it is now possible, for example by means of a corresponding movement of the common carrier of the contact banks 52–55, to operatively connect any of the conductor banks to the ignition electrodes $Z_{11}$–$Z_{20}$, whereby the common terminal point H is connected to the respective ignition electrodes of the selected switches.

The ignition voltage G operable to effect a switching of the connected thyristors 11–20, which are advantageously of like design, i.e. like operational characteristics, advantageously is disposed between the common terminal point H of the contact banks and the terminal point B, whereby the ignition voltage is simultaneously applied to a current conducting terminal electrode of all thyristors 11–20 and to the ignition electrodes of the selected switches over the respective contacts $k_{10}$–$k_{20}$ in dependence upon the respective bank positions as determined by the stepping motor 56.

As the electronic switches, in particular thyristors, automatically return to a nonconductive state at each zero passage of the A.C. voltage applied thereto, a correspondingly poled ignition voltage G must be applied during each zero passage at the respective transistor, to the ignition electrodes of the thyristors which are to be maintained in the conductive state. Consequently, it may be desirable to connect the terminals points of a zero voltage switch, for example such as illustrated in FIGS. 2 or 3, to the terminal points E and F of the arrangement illustrated in FIGS. 2 or 3, between the point B of the circuit illustrated in FIG. 1 and the ignition electrodes associated with the circuit of FIG. 5, and as illustrated in FIG. 1. Thus, the zero voltage control is automatically simultaneously effective at each one of the switches 11–20, in dependence upon the operational state I–IV currently in operation, whereby the switch 10 becomes unnecessary and may be omitted.

Also, a correspondingly dimensioned direct voltage G may be employed as the ignition voltage and may be applied between the point B of the circuit illustrated in FIG. 1 and the point H of the circuit illustrated in FIG. 5. However, it will be advantageous to use a special thyristor 10 in accordance with FIGS. 1 through 3, but only $m$ half oscillations or cycles will comprise the heating current through the rod-shaped carrier 1 instead of $m$ complete cycles or oscillations.

Also, ignition impulses, synchronous with the AC line voltage 9, can also be directly produced by means of a full wave rectification of the voltage 9 and the supply of the rectified voltage to a load capacitor which is bridged by a Zener diode.

The switch-over signals produced by the calculator 44 are employed for controlling the stepping switch motor 56 and, advantageously, the individual switch-over signals, supplied by the calculator 44, in the case of $m = m_1$ or $m_2$, consist of rectangular impulses, whereby the forward signals and the reverse signals merely differ in the polarity of the impulses. Correspondingly, the motor 56 always moves in one direction during a forward impulse and in the opposite direction during a reverse impulse. Consequently, in the presence of a I position of the motor, the position II is effected during the first forward step, the position III during the second forward step and the position IV during the third forward step. Synchronously with the switch over operation, the operational switch stages I, II, III or IV, respectively, are achieved. When a reverse signal is applied the succession is merely run through in the opposite direction.

It should also be noted that a phase gating control, of the type illustrated in German Offenlengungsschrift 2,133,863 may be additionally provided which may be alternately operative with respect to the carrier rod 1 where small heating currents J are required, i.e. thin carrier rods 1 with small thermal time constants are involved.

Having thus described my invention with respect to preferred embodiments, it is not to be so limited, as changes and modifications may be made which are within the full intended scope as defined by the appended claims.

We claim:

1. A device for the deposition of semiconductor material, in particular silicon, from a reaction gas permitting the thermal separation of the respective semiconductor material and the deposition upon the surface of a rod-shaped carrier made of semiconductor material which is heated within the reaction gas, in which the rod-shaped carrier, for the heating thereof, is supplied from a supply line over a remote-control electronic switch, with heating current from an alternating voltage source, with the heating current controlled over an auxiliary voltage actuating the remote-control electronic switch, the combination of a transformer having a primary winding adapted to be connected to an A.C. voltage source, said transformer having at least two separate secondary windings of like electrical characteristics, which can be applied in series with the rod-shaped carrier, remote-control electronic switches for selectively connecting said windings in series with the rod-shaped carrier whereby said carrier is selectively connected with an individual secondary winding, a plurality of secondary windings connected in series and/or parallel relation, a zero-voltage oscillation control unit, at least one electronic switch, controlling the flow of heating current through the rod-shaped carrier, controlled by said zero-voltage oscillation control unit, and an electronic threshold-value switch, responsive to current flow through said rod-shaped carrier, for controlling said remote-control switches to determine the secondary winding or windings operatively connected to said rod-shaped carrier, whereby different voltage-current relationships may be provided thereat.

2. A device according to claim 1, wherein the zero-voltage oscillation control unit is connected only to one individual electronic switch which carries the entire heating current independently of the particular combination of secondary windings supplying the heating current.

3. A device according to claim 1, wherein the zero-voltage oscillation control unit is connected to and controls at least one of the electronic switches individually connected to the respective secondary windings.

4. A device according to claim 1, wherein at least four mutually equal secondary windings are provided for the supply of the heating current traversing the rod-shaped carrier, which secondary windings are connectable in series by means of certain of said electronic switches, one side of such series of secondary windings being connectable over a further of said electronic switches to a first branch point which is connected to one end of said rod-shaped carrier, other of said electronic switches being operable to connect individual secondary windings to said branch point over a corresponding of said electronic switches, with the opposite end of such secondary winding being connectable to a second branch point which is connected to the opposite end of the rod-shaped carrier.

5. A device according to claim 1, comprising in further combination a sensor operatively connected to the supply line to said carrier by means of which the heating current traversing the rod-shaped carrier is controlled.

6. A device according to claim 5 wherein said sensor comprises a low-loss transformer having a primary winding connected in series with the rod-shaped carrier and a secondary winding connected to and controlling the zero-voltage oscillation control unit and/or the threshold-value switch.

7. A device according to claim 6, wherein said sensor is connected to a fullwave rectifier circuit, the output of which is connected to a peak-value rectifier, the output voltage of which is proportional to the amplitude $J_o$ of the heating current, and is conducted to a multiplier circuit for the formation of an output voltage proportional to the product of two applied voltages, the multiplier circuit being supplied with voltage proportional to the magnitude $(m/2n)^{\frac{1}{2}}$ (in which $n$ = number of oscillations per second of the AC voltage supplying the heating current, $m$ = number of oscillations per second actually supplied to the rod-shaped carrier by the zero-voltage oscillation control), whereby a voltage $v$ proportional to the product $J_o \cdot (m/2n)^{\frac{1}{2}}$ appears at the output of the multiplier circuit and is conducted to and is operable to actuate the zero-voltage oscillation control unit and/or the threshold-value switch, effecting a regulation while effecting comparison with a comparison voltage $v_o$ supplied by a desired-value generator.

8. A device according to claim 7, comprising a counter to which the output of said full wave rectifier is supplied for counting the number $m$, a counter to which the oscillations forming the value $n$ are supplied, the output of said counters being conducted to a calculator operative to calculate therefrom the value $(m/2n)^{\frac{1}{2}}$ supplied to the zero-voltage oscillation control unit.

9. A device according to claim 8 wherein for the comparison of the voltage $v$ with a reference voltage $v_o$, means are provided for forming from said voltages a superimposition in the form of a difference formation, which is supplied to the zero-voltage oscillation control unit, and means for so controlling the value $v_o$, responsive to the temperature of the rod-shaped carrier, that the temperature is maintained constant.

10. A device according to claim 9, wherein a lower boundary value $m_1/n$ and an upper boundary value $m_2/n$ provided for the ratio $m/n$ with $m_1 \leq m \leq m_2$ and means responsive to values below and above the permissible respective boundary values for effecting actuation of the threshold-value switch to vary the secondary winding connections in a direction to return $m$ into the permissible range.

11. A device according to claim 10 comprising the means connected to the calculator determining the product $(m/2n)^{\frac{1}{2}}$, for producing signal impulses when $m$ leaves the permissible range, said threshold-value switch including an actuating stepping motor therefor, to which said signal impulses are conducted, said threshold-value switch comprising switch means for actuating said remote control switches to connect the respective combinations of secondary windings to the rod-shaped carrier, whereby succesive actuation of the stepping motor in response to such impulses is operative to connect successive combinations of secondary windings to said carrier.

12. A device in accordance with claim 11, wherein triacs are used as said remote control switches, the ignition-voltage therefor being derived from the zero-voltage oscillation control unit.

13. A device according to claim 1, wherein a sensor controlled by the heating current traversing the rod-shaped carrier is connected to a fullwave rectifier circuit, the output of which is connected to a peak-value rectifier, the output voltage of which is proportional to the amplitude $J_o$ of the heating current, and is conducted to a multiplier circuit for the formation of an output voltage proportional to the product of two applied voltages, the multiplier circuit being supplied with voltage proportional to the magnitude $(m/2n)^{\frac{1}{2}}$ (in which $n$ = number of oscillations/per second of the AC voltage supplying the heating current, $m$ = number of oscillations/per second actually supplied to the rod-shaped carrier by the zero-voltage oscillation control), whereby a voltage $v$ proportional to the product $J_o \cdot (m/2n)^{\frac{1}{2}}$ appears at the output of the multiplier circuit and is conducted to and is operable to actuate the zero-voltage oscillation control unit and/or the threshold-value switch, effecting a regulation while effecting comparison with a comparison voltage $v_o$ supplied by a desired-value generator.

14. A device according to claim 13, comprising a counter to which the output of said full wave rectifier is supplied for counting the number $m$, a counter to which the oscillations forming the value $n$ are supplied, the output of said counters being conducted to a calculator operative to calculate therefrom the value $(m/2n)^{\frac{1}{2}}$ supplied to the zero-voltage oscillation control unit.

15. A device according to claim 13 wherein for the comparison of the voltage $v$ with a reference voltage $v_o$, means are provided for forming from said voltages a superimposition in the form of a difference formation, which is supplied to the zero-voltage oscillation control unit, and means for so controlling the value $v_o$, responsive to the temperature of the rod-shaped carrier, that the temperature is maintained constant.

16. A device according to claim 15 comprising means connected to a calculator determining the product $(m/2n)^{\frac{1}{2}}$, for producing signal impulses when $m$ leaves the permissible range, said threshold-value switch including an actuating stepping motor therefor, to which said signal impulses are conducted, said threshold-value switch comprising switch means for actuating said remote control switches to connect the respective combinations of secondary windings to the rod-shaped carrier, whereby successive actuation of the stepping motor in response to such impulses is operative to connect successive combinations of secondary windings to said carrier.

17. A device in accordance with claim 16, wherein triacs are used as said remote control switches, the ignition-voltage therefor being derived from the zero-voltage oscillation control unit.

18. A device according to claim 1, wherein a lower boundary value $m_1/n$ and an upper boundary value $m_2/n$ provided for the ratio $m/n$ with $m_1 \leq m \leq m_2$ in which $n=$number of oscillations/per second of the AC voltage supplying the heating current, $m=$number of oscillations/per second actually supplied to the rod-shaped carrier by the zero-voltage oscillation control, and means responsive to values below and above the permissible respective boundary values for effecting actuation of the threshold-value switch to vary the secondary winding connections in a direction to return $m$ into the permissible range.

* * * * *